United States Patent [19]

Turnbull

[11] Patent Number: 4,894,544
[45] Date of Patent: Jan. 16, 1990

[54] ARRAYS OF INFRARED DETECTOR ELEMENTS

[75] Inventor: Andrew A. Turnbull, Reigate, England

[73] Assignee: U.S. Philips Corp., New York, N.Y.

[21] Appl. No.: 206,648

[22] Filed: Jun. 14, 1988

[30] Foreign Application Priority Data

Jul. 10, 1987 [GB] United Kingdom ............... 8716238

[51] Int. Cl.⁴ ............................................. G01J 5/06
[52] U.S. Cl. ............................... 250/338.3; 250/332; 250/349
[58] Field of Search ................. 250/338.3, 338.2, 349, 250/332

[56] References Cited

U.S. PATENT DOCUMENTS 4,072,863  2/1978  Roundy .............................. 250/330
4,532,424  7/1985  Cheung .......................... 250/338.3

FOREIGN PATENT DOCUMENTS 0173368   3/1986  European Pat. Off. .
35118     2/1984  Japan ............................. 250/338.3
1525562   9/1975  United Kingdom .
2030023   3/1980  United Kingdom .
2080614   2/1982  United Kingdom .
2100058  12/1982  United Kingdom .

OTHER PUBLICATIONS

SPIE, vol. 588 "Recent Developments in Materials and Detectors for the Infrared", (1985) pp. 38–43.

Primary Examiner—Carolyn E. Fields
Attorney, Agent, or Firm—William L. Botjer

[57] ABSTRACT

Each element of an array of infrared detector elements comprises a capacitor formed by a body (11) of pyroelectric or ferroelectric material between a front electrode (14) and a back electrode (12). The elements have individual electrical connections (13) to their back electrode (12) from which there are derived electrical signals which differ as the temperature of the body (11) changes in response to incident infrared radiation (50). These individual electrical connections (13) are provided by a pattern of conductors (13) carried by a support (10) on which the elements are mounted. Each element has at least an infrared-collection area (21) of larger lateral dimensions (x) than at least the electrical connection (13) to the back electrode (12) whereby a peripheral part (23) of each element overhangs and is separated vertically from an underlying part of the support (10). In accordance with the invention, the elements are arranged in a 2-dimensional array with inner elements of the array surrounded by outer elements of the array. The conductors (13) to the inner elements extend on a part of the support (10) between the outer elements and below the overhanging peripheral parts (23) of these outer elements. These conductors (13) of the inner elements are separated from the back electrode (12) and overhanging peripheral parts (23) of the outer elements and from the individual electrical connections (13) of these outer elements by a gap (y,z) sufficient to avoid any troublesome parasitic capacitance across a detector element or any significant capacitive cross-talk between the detector elements. The width of the intermediate conductor tracks (13) and the dimensions (y,z) of the surrounding gap may be larger than the spacing between the overhanging peripheral parts (23) of adjacent elements and, for example, as large as or larger than the thickness of the element bodies (11). The array can be fabricated cheaply and reliably using thick-film techniques to form the conductors (13) on a good thermally insulative support (10), so also providing low thermal cross-talk between the detector elements.

12 Claims, 2 Drawing Sheets

ARRAYS OF INFRARED DETECTOR ELEMENTS

BACKGROUND OF THE INVENTION

This invention relates to arrays of infrared detector elements of pyroelectric or ferroelectric material, and in particular 2-dimensional arrays of such elements which may be used, for example, for thermal imaging purposes requiring an inexpensive image sensor.

Arrays of infrared detector elements mounted on a support are well known, in which each element comprises a capacitor formed by a body of pyroelectric or ferroelectric material between a front electrode and a back electrode at respective front and back major faces. The back major face of the body faces the support. The elements have individual electrical connections to their back electrode from which there are derived electrical signals which differ as the temperature of the body changes in response to incident infrared radiation. By having these individual back connections, the signals derived from the individual detector elements can be fed to, for example, separate amplifiers via separate outputs. At their front major face, all the elements of the array may have a common electrical connection to their front electrodes, or groups of the elements may have common connections.

A linear array of such infrared detector elements of high performance but inexpensive to manufacture is disclosed in the paper entitled "The application of heat-collector fins to reticulated pyroelectric arrays" by A. A. Turnbull, presented in Cannes, France in Nov. 1985 and published in the Proceedings of SPIE (Society of Photo-Optical Instrumentation Engineers, USA) Vol. 588, Recent developments in materials and detectors for the infrared (1985), pages 38 to 43. The individual back connections of these pyroelectric elements are provided by a pattern of conductors carried by the support which in the form disclosed in this SPIE paper is a polyimide membrane. Each element has an infrared-collection area in the form of a metal/dielectric/metal sandwich structure (termed a "heat fin") of larger lateral dimensions than both the individual pyroelectric body of each element and the electrical connection to its back electrode. This fin forms a peripheral portion of each element which overhangs and is separated vertically from an underlying part of the support. The whole contents of said SPIE paper by A. A. Turnbull are hereby incorporated as reference material in the present specification.

As described in said SPIE paper, the infrared active area of each element is defined with high precision by the array of heat fins which are formed by thin film techniques and which are spaced apart by gaps of, for example, 20 μm (micrometres), while reticulating the pyroelectric material into individual bodies which are spaced apart by gaps of, for example, 50 μm. This permits the gaps between the bodies to be formed by sawing in a convenient manner through the pyroelectric material. The provision of the overhanging heat fin also improves the Noise Equivalent Power (NEP) of the pyroelectric detector element, as described in more detail in published United Kingdom Patent Application GB-A-2 100 058, the whole contents of which are hereby also incorporated as reference material in the present specification. In the case of pyroelectric materials the electrical signals result from electrical charges generated at the major faces as a result of the spontaneous dipole moment of the material changing with change in temperature. However, such detector element structures with heat fins may also be used with ferroelectric material operated near its Curie temperature so that its dielectric constant is a strong function of temperature. In this case the electrical signals may be derived as a difference in the magnitude of a voltage across the capacitor detector element at different temperatures.

It is known to form 2-dimensional arrays of pyroelectric and other ferroelectric infrared detector elements by mounting the array on a silicon circuit substrate comprising, for example, a switching matrix of MOS transistors for addressing the individual detector elements. The electrical connections to the back electrodes of the detector elements are formed in a vertical configuration by, for example, electro-deposited metal rods, solder bumps, or metallised bores between the detector elements and the silicon circuitry. Examples of such structures are described in, for example, published United Kingdom patent application GB-A-2 030 023, U.S. Pat. No. US-A-4 532 424 and US-A-4 072 863, and published European patent application EP-A-0 173 368. The electrical signal generated by each detector element arises from a change in its temperature in response to the infrared radiation collected by that element, so that the thermal isolation of the individual elements is important. In the known 2-dimensional array structure it is not easy to obtain good thermal isolation of the individual elements both from the underlying silicon circuit which has a large thermal capacitance and from each other due to the thermal paths present between the elements and their back connections. Thus, in general, the detector elements in these known 2-dimensional arrays have inferior thermal isolation as compared with fully reticulated elements mounted on a support of electrically and thermally insulating material, for example on a polyimide film as described in the said SPIE paper and in GB-A-2 100 058. Furthermore, the mechanical reliability of the small cross-section electrodeposited rods and solder bumps as connections to a silicon circuit is not entirely satisfactory for a volume manufacturing process, and this approach can be expensive, especially for 2-dimensional arrays with a small number of detector elements, for example a square array of 6×6 elements or less. Thus, it is more expensive than using thin or thick-film techniques with wide conductor tracks. However, in order to facilitate the use of thick-film techniques in a reliably reproduceable manner in a volume manufacturing process, it is desirable for the conductor tracks to be wider than the spacing normally desired between detector elements in a 2-dimensional array.

SUMMARY OF THE INVENTION

According to the present invention there is provided an array of infrared detector elements mounted on a support, each element comprising a capacitor formed by a body of pyroelectric or ferroelectric material between a front electrode and a back electrode at respective front and back major faces of the body, which back major face faces the support, the elements having individual electrical connections to their back electrode from which there are derived electrical signals which differ as the temperature of the body changes in response to incident infrared radiation, which individual electrical connections are provided by a pattern of conductors carried by the support, each element having at least an infrared-collection area of larger lateral dimensions than at least the electrical connection to the back electrode whereby a peripheral part of each element overhangs and is separated vertically from an underlying part of the support, the array being characterised in that the elements are arranged in a 2-dimensional array with inner elements of the array surrounded by outer elements of the array, and in that the conductors which provide said individual electrical connections to the inner detector elements extend on a part of the support between the outer detector elements and below the overhanging peripheral parts of these outer elements.

Such an arrangement of the conductors of the inner detector elements between the outer detector elements and below the overhanging parts of the outer elements, permits the formation of a compact 2-dimensional array and its conductors on a support of, for example, polyimide or another good thermally and electrically insulating material, using technologies such as for example thick film stencil and printed-circuit techniques which are low cost and reliable in volume manufacturing processes, while providing good thermal isolation for the individual detector elements which can be fully reticulated on such a support, and while maintaining a high percentage of infrared active area in the array due to the (overhanging) infrared-collection area of each detector element being larger than the lateral dimensions of at least the conductor connection to its back electrode. Thus, the conductors of the inner elements at least where they extend between the outer elements can have a width which is larger than a spacing between the (overhanging) peripheral parts of adjacent outer detector elements.

Although the detector elements are themselves capacitors, a sufficient gap can readily be provided as a separation between the relevant parts of the outer and inner elements to reduce the capacitance therebetween so as to avoid introducing any significant capacitive cross-talk between the inner and outer detector elements or any parasitic capacitance across a detector element. Thus, the conductors of the inner detector elements can be separated from the back electrode of the outer elements and from the individual electrical connections of these outer elements by a gap larger than a spacing between the (overhanging) peripheral parts of adjacent outer detector elements, and these conductors of the inner elements can be separated from the overhanging peripheral parts of the outer elements (and a possible common front connection) by a gap larger than at least half the thickness of the body of the detector elements.

The present invention is particularly suitable for 2-dimensional arrays having a small number of detector elements.

Various technologies may be used to form the detector element structure with its peripheral overhang and with the large lateral dimensions for its infrared-collection area. Each detector element may comprise an individual body of the pyroelectric or ferroelectric material having about the same lateral dimensions as the infrared-collection area, and this body may even form the infrared-collection area. However, particularly advantageous characteristics are obtained when the individual pyroelectric or ferroelectric body of each detector element is located beneath the infrared-collection area of that element and has smaller lateral dimensions than the infrared-collection area. In this case the individual infrared-collection area of each element may be of infrared-absorbing material, for example such as disclosed for the heat fins in said SPIE paper and GB-A-2 100 058, or it may be of infrared transmissive material which may form a concentrating lens or a light pipe for its respective element, or it may even be a reflective hollow light pipe. Depending on the particular structure of the detector element, the vertical separation between the overhanging peripheral part of an outer detector element and the underlying conductor of an inner detector element may correspond to the thickness of the pyroelectric or ferroelectric material, and/or of a thickened part of the pattern of conductors where it contacts the back face of the detector elements, and/or of a recess in the part of the support between the outer detector elements.

BRIEF DESCRIPTION OF THE DRAWINGS

These and other features in accordance with the invention are illustrated specifically in embodiments of the invention now to be described, by way of example, with reference to the accompanying diagrammatic drawings, in which.

DETAILED DESCRIPTION OF THE PREFERRED EMBODIMENTS

Figure 1:
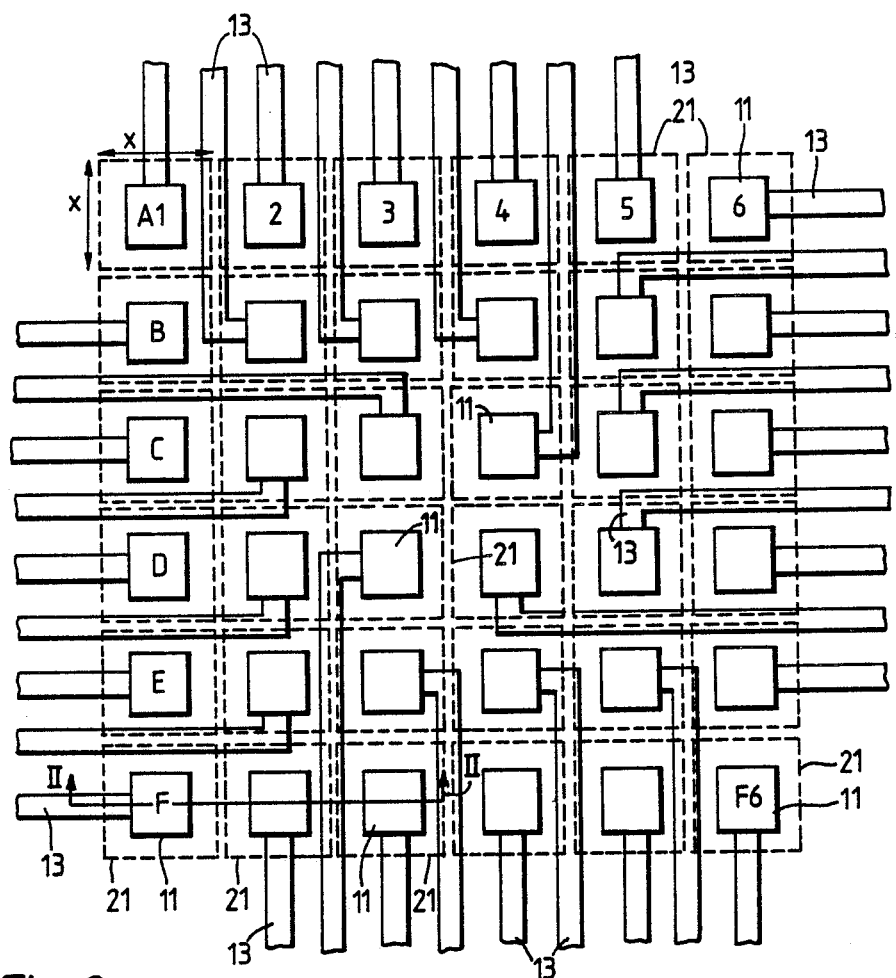
FIG. 1 is a plan view of a 2-dimensional array of infrared detector elements mounted on a support in one embodiment of the present invention.

It should be noted that all the Figures are diagrammatic and are not drawn to scale. The relative dimensions and proportions of parts of these Figures (particularly in the direction of thickness of the cross-sections) have been shown exaggerated or diminished for the sake of clarity and convenience in the drawings. The same reference signs as used in one embodiment are generally used for referring to corresponding or similar parts in the other embodiments.

Figure 2:
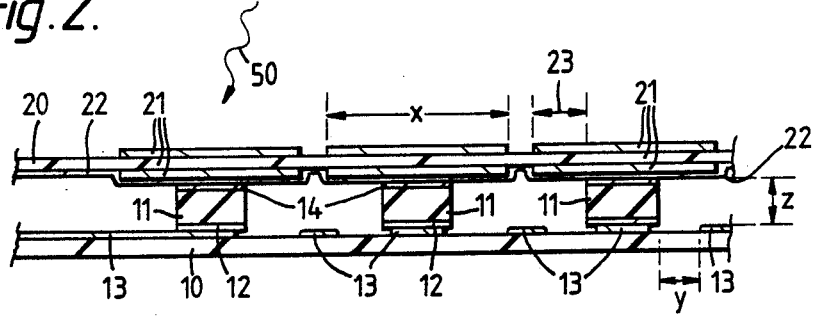
FIG. 2 is a cross-section on the line II—II of FIG. 1.

The array of FIGS. 1 and 2 comprises infrared detector elements A1 to F6 mounted on a support 10. Each element A1 to F6 comprises a capacitor formed by a body 11 of pyroelectric or ferroelectric material between a front electrode 14 and a back electrode 12 at its respective front and back major faces. The back major face is mounted facing the support 10. The elements A1 to F6 have individual electrical connections 13 to their back electrode 12, from which electrical signals are derived which differ as the temperature of the body 11 changes in response to incident infrared radiation 50. These individual back connections are provided by a pattern of conductors 13 carried by the support 10. Each element A1 to F6 has an infrared-collection area 21 of larger lateral dimensions x than the electrical connection 13 to the back electrode 12 of the body 11. In the embodiment of FIG. 2, the lateral dimensions x of the infrared-collection area 21 are larger than those of the underlying body 11 of that element so that this area 21 provides each element with a peripheral part 23 which overhangs and is separated vertically from an underlying part of the support 10.

In accordance with the present invention, the detector elements A1 to F6 are arranged in a 2-dimensional array, with references from 1 to 6 in one dimension and from A to F in the other dimension for the example illustrated in FIG. 1. Inner elements of the array, such as elements C3 and D4, are surrounded by outer elements of the array, such as A1 to A6 and F1 to F6. The conductors 13 which provide the individual back connections to the inner detector elements extend between the outer detector elements. Thus, as illustrated in FIG. 1, the conductor 13 of D3 extends outwards between E2 and E3 and between F2 and F3, and the conductor 13 of E3 extends outwards between F3 and F4. These conductors 13 of the inner elements extend on a part of the support 10 below the overhanging peripheral parts 23 of these outer elements as illustrated in FIG. 2. They are separated from the back electrode 12 of the outer elements (and from their individual connections 13) by a gap y sufficient to avoid any significant capacitive cross-talk between the inner and outer detector elements in spite of the conductors 13 having a large width.

In the form illustrated in FIG. 2, the infrared-collection areas 21 are of the heat fin type such as is described in the said SPIE paper and in GB-A-2 100 058. Apart from the geometry of the pattern of conductors 13 and the 2-dimensional arrangement of the array of elements A1 to F6, the array of FIGS. 1 and 2 may be fabricated in the same or similar manner to the detectors described in said SPIE paper and in GB-A-2 100 058 and with the same or similar materials.

Thus, the support 10 may be a film of electrically and thermally insulating material, for example a polyimide membrane, on which the individual bodies 11 are resiliently supported. The connections 13 may be conductive tracks of, for example, gold on a thin seeding layer of nickel-chromium alloy. These tracks 13 may be fabricated cheaply by thick-film techniques on the surface of the support 10. The individual bodies 11 may be of, for example, ceramic lead lanthanum manganese zirconium titanate (PLMZT) pyroelectric material having thin electrode coatings 14 and 12 of, for example, nickel-chromium alloy on their front and back major faces. Front electrode connection(s) 22 and an array of heat fins 21 may be carried on another film 20 of electrically and thermally insulating material, for example a polyimide membrane. Thus, the individual bodies 11 of the array may be mounted between and encapsulated by these two films 10 and 20.

The heat fins 21 may each comprise an area of nickel-chromium alloy on the front of the dielectric film 20 and aligned with a reflective area of gold on the back of the film 20 so as to form a metal-dielectric-metal sandwich which is thermally coupled to the front major face of the underlying body 11. This heat-fin sandwich acts in known manner to absorb the incident infrared radiation 50 and to transmit the heat generated thereby to the body 11. The common front connection(s) 22 of the array may be a thin layer of gold which may cover the whole back area of the film 20 or which may be, for example, parallel tracks each connecting together elements of an array row in one direction, for example all detector elements A1 to A6 or all detector elements A1 to F1.

In a typical example of the embodiment of FIG. 2, the individual bodies 11 may have front and back major faces each of 100 $\mu$m $\times$ 100 $\mu$m, the heat fins 21 may have dimensions x of 180 $\mu$m $\times$ 180 $\mu$m, and the spacing between adjacent fins 21 may be 20 $\mu$m. Thus, in this example, the elements A1 to F6 have a pitch of 200 $\mu$m in the array, and the width of the space between adjacent bodies 11 in the array is 100 $\mu$m. The width of the conductors 13 where they contact the back electrode 12 of the elements may be about the same as the back face (100 $\mu$m in this example) or they may be narrower. Where the conductors 13 extend as tracks on the surface of the support 10, from their respective detector element towards the periphery of the support 10, they may have a width of, for example, 30 $\mu$m, which is wider than the spacing between the fins 21. Adjacent the periphery of the support 10, the tracks 13 may widen to form terminal pads, for example for a wire bond or a terminal pin or a solder connection. In this typical example, the thickness of the individual bodies 11 may be about 30 $\mu$m. It is this thickness which determines a vertical separation z provided by the gap between the overhanging peripheral part 23 of an outer detector element and an underlying conductor track 13 of an inner detector element of the array, and so the parasitic capacitance in parallel with the detector elements is insignificant. With the element structure illustrated in FIG. 2, the overhanging part 23 is connected to the common conductor 22 at, for example, earth potential and so does not contribute any significant cross-talk between the detector elements. The horizontal dimension y of the gap in FIG. 2 determines the separation between the conductor 13 of an inner element and the back electrode 12 and its conductor 13 of an outer element. This dimension y is important to the consideration of capacitive cross-talk, and in this typical example with back electrodes 12 of 100 $\mu$m $\times$ 100 $\mu$m and conductor tracks 13 of 30 $\mu$m width, the distance y is 35 $\mu$m which is wider than the thickness (30 $\mu$m) of the detector elements and wider than the spacing (20 $\mu$m) between the fins 21.

With these dimensions for the FIG. 2 structure, the horizontal capacitance between a conductor 13 of an inner element and the back electrode 12 (and its conductor 13) of a neighbouring outer element is approximately $4 \times 10^{-3}$ pF, assuming the gap is filled with air or another gas or a vacuum. The capacitance of one detector element with these body dimensions of 100 $\mu$m $\times$ 100 $\mu$m $\times$ 30 $\mu$m is $2.9 \times 10^{-15}$ x k farads, where k is the dielectric constant of the material of the body 11. With PLMZT material, k is approximately 500, and so the capacitance of the elements is 1.46 pF. Thus, in this case the capacitance cross-talk between inner and outer elements of the FIG. 2 structure as a result of the above horizontal capacitance of $4 \times 10^{-3}$ pF is about 0.3%. With a material having a low dielectric constant, for example tri-glycine sulphate with k=40, the element capacitance is lower, for example 0.12 pF so that the capacitance cross-talk in this case is about 3.2%. These values of capacitive cross-talk would normally be regarded as insignificant.

This situation may be compared with a structure which is not in accordance with the present invention. No heat fins are used in this comparison structure, and the bodies 11 are 180 $\mu$m $\times$ 180 $\mu$m and are separated by a 20 $\mu$m spacing in order to maintain the same 200 $\mu$m pitch. This spacing contains an inner detector-element conductor 13 having a width of only 6 $\mu$m and separated horizontally by gaps y of 7 $\mu$m from the neighbouring outer detector-element back electrodes 12. In this situation, the horizontal capacitance is about $5 \times 10^{-2}$ pF, and this leads to a capacitance cross-talk of from about 1% for k=500 to 13% for k=40. In addition to this increase in capacitive cross-talk, the conductor tracks 13 having a width of only 6 μm (instead of 30 μm) cannot easily be fabricated by thick-film techniques, so rendering the manufacture more expensive.

In the embodiment illustrated in FIG. 2, the wide infrared-collection area 21 comprises infrared-absorbing material. However, in a modified form, another type of wide infrared-collection area may be used, for example an optical immersion lens or a light pipe. Such lenses may be mounted over the narrower detector element bodies 11 in a manner similar to those disclosed in published United Kingdom patent application GB-A-2 080 614 for pyroelectric detector elements, and the individual lenses may form segments of a single plate mounted at the front of the array, for example as described in published United Kingdom patent specification GB-A-1 525 562.

It will be evident that many other modifications are possible within the scope of the invention. Although it is not so important in the FIG. 2 structure, the vertical separation z may be increased between the overhanging peripheral part 23 of an outer detector element and an underlying conductor track 13 of an inner detector element in the array of FIGS. 1 and 2. Thus, each body 11 may be mounted on an elevated conductive part of the conductors 13, this elevated part being at a higher level than the level of the conductors 13 on the part of the support 10 between the outer detector elements. This may be achieved in particular structures by thickening the element-mounting part of the conductors 13 and/or by providing a recess in some forms of support 10 between the outer detector elements. By these means, the vertical separation z between a heat-fin/-front-connection of an outer element and the underlying conductor 13 of an inner element can be made larger than the thickness of the bodies 11. This is particularly advantageous when using thin bodies 11, because the increased separation z not only reduces parasitic capacitance in parallel with the detector elements but also reduces any tendency for short-circuit resulting from direct contact between the front and back connections 22 and 13, for example as a result of flexing by a front film 20.

Figure 3:
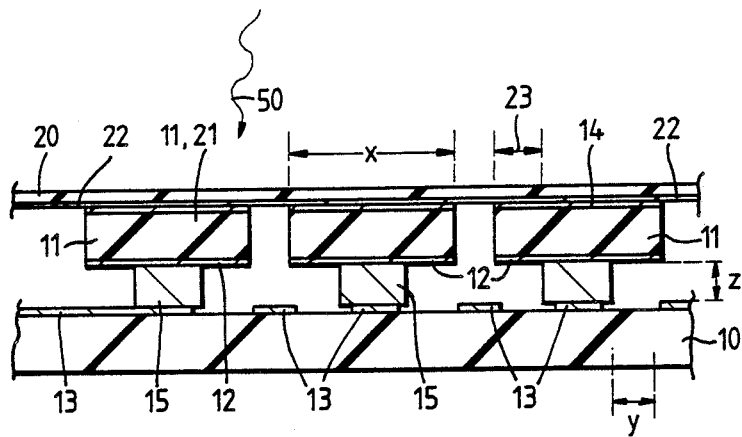
FIG. 3 is a similar cross-section to that of FIG. 2, showing various modifications in an array which is also in accordance with the present invention.
Figure 4:
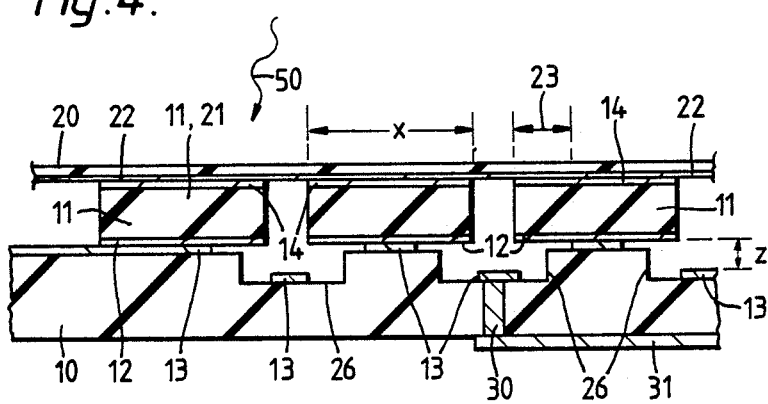
FIG. 4 is a similar cross-section to that of FIG. 2, showing various other modifications in an array which is also in accordance with the present invention.

However, such an elevated conductive part of the conductors 13 may also be used to provide the whole vertical separation z, for example as in the embodiments of FIGS. 3 and 4. In these embodiments the distance z is important in determining the capacitive cross-talk. The elevated conductive part has a smaller width than the back face of the associated body 11, and the lateral dimensions x of the individual bodies 11 of pyroelectric/ferroelectric material correspond substantially to those of the infrared-collection areas 21. The infrared 50 may be absorbed in the bodies 11 or/and in a coating at the front major face of the bodies 11. In these cases, the overhanging peripheral part 23 of the detector elements comprises part of the pyroelectric/ferroelectric body 11 and its back electrode 12, and the capacitive cross-talk to be avoided is between an underlying conductor 13 of an inner element and the body 11 and back electrode 12 of an outer element of the array. For this purpose, the vertical dimension z of the gaps separating the back electrode 12 and conductor 13 of an outer element from an underlying conductor 13 of an inner element is chosen to be larger than at least half the thickness of the bodies 11 and preferably larger than the spacing between adjacent element bodies 11. Horizontal dimensions similar to those in the example for FIG. 2 may be used in an example of either the FIG. 3 or FIG. 4 embodiment, except that the width of the bodies 11 and back electrode 12 is 180 μm (instead of 100 μm) and their spacing is 20 μm (instead of 100 μm).

The embodiment of FIG. 3 has plated-up, thickened parts 15 to provide the elevated conductive parts of the pattern of conductors 13, and this arrangement can be used with a flexible film, for example a polyimide membrane, as the support 10. However, instead of a membrane, thicker supports 10 may be used in the embodiment of FIG. 3 (and in that of FIG. 2) in the manner of a printed-circuit board, and these supports may be of a rigid or of an elastic nature. By making these supports 10 of good thermally and electrically insulating material, good thermal isolation is still provided for each detector element. Suitable materials for a thicker support 10 are, for example, an acrylic or a silicone rubber. In the FIG. 3 structure the horizontal dimension y between the thickened conductor part 15 and the intermediate conductor 13 is also important for reducing the capacitive cross-talk. The horizontal dimension of the gap is less important in the FIG. 4 structure.

The embodiment of FIG. 4 is particularly suitable for thick supports 10, since in this case the elevated part is formed by providing a recess 26 in the part of the support 10 between at least the outer detector elements. The conductors 13 on this part extend on the bottom of the recess 26 so as to be located at a lower level than the elevated conductor parts on which the back face of the bodies 11 is mounted. The recess 26 may form a grid of channels extending between the sites where the bodies 11 are mounted, so that the conductor tracks 13 of inner elements extend from these sites over the wall of the channel and then along the bottom of the channel to the periphery of the support 10. These channels can be fabricated by moulding or pressing in the case of a support 10 of plastics material, or by etching in the case of a suitable rigid substrate.

Although a square array of 6×6 detector elements is illustrated in FIG. 1, other numbers of detector elements and other configurations may be used, for example a rectangular array. With larger numbers of detector elements in the array, it may be desirable or even necessary (depending on the array configuration) to bring out more than one conductor track 13 through one space between two outer detector elements of the array. As already known with printed-circuit technology, it is also possible to form metallised via-holes through the thickness of the support 10 to carry (over part of its length) the connection 13 of some of the inner detector elements of a larger 2-dimensional array; these particular connections 13 then extend along the back surface of the support 10 for the remainder of their length, and capacitive cross-talk with other conductors 13 on the front surface of the support 10 can be avoided by having a sufficient thickness for the insulating support 10. An example of such a metallised via-hole 30 and back conductive track 31 is illustrated in FIG. 4.

From reading the present disclosure, other modifications will be apparent to persons skilled in the art. Such modifications may involve other features which are already known in the design and use of infrared systems and detectors and component parts thereof and in printed-circuit technology. Such features may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification thereof which would be obvious to persons skilled in the art, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. An array of infrared detector elements mounted on a support, each element comprising a capacitor formed by a body of pyroelectric or ferroelectric material between a front electrode and a back electrode at respective front and back major faces of the body, which back major face faces the support, the elements having individual electrical connections to their back electrode from which there are derived electrical signals which differ as the temperature of the body changes in response to incident infrared radiation, which individual electrical connections are provided by a pattern of conductors carried by the support, each element having at least an infrared-collection area of larger lateral dimensions than the portion of the electrical connection to the back electrode which underlies the back electrode whereby a peripheral part of each element overhangs and is separated vertically from an underlying part of the support, characterised in that the elements are arranged in a 2-dimensional array with inner elements of the array surrounded by outer elements of the array, and in that the conductors which provide said individual electrical connections to the inner detector elements extend on a part of the support between the outer detector elements and below the overhanging peripheral parts of these outer elements.

2. An array as claimed in claim 1, further characterised in that the conductors of the inner elements are separated from the back electrode of the outer elements and from the individual electrical connections of these outer elements by a gap larger than a spacing between the peripheral parts of adjacent outer detector elements.

3. An array as claimed in claim 1, further characterised in that the conductors of the inner elements at least where they extend between the outer elements have a width which is larger than a spacing between the peripheral parts of adjacent outer detector elements.

4. An array as claimed in claim 1, further characterised in that each detector element comprises an individual body of the pyroelectric or ferroelectric material located beneath the infrared-collection area of that element, and that the lateral dimensions of each individual body is less than those of the infrared-collection area of that element.

5. An array as claimed in claim 4, further characterised in that each infrared-collection area is formed by a region of infrared-absorbing material which is thermally coupled to the front major face of the underlying body of the detector element so as to transmit heat generated on absorption of the incident infrared radiation to the body.

6. An array as claimed in claim 5, further characterised in that the individual bodies of the detector elements are mounted between said support and a film of electrically and thermally insulating material, and that the film carries the regions of infrared-absorbing material and one or more common electrical connections to the front electrode of the bodies.

7. An array as claimed in claim 1, further characterised in that each detector element comprises an individual body of the pyroelectric or ferroelectric material, and that said support comprises a film of electrically and thermally insulating material on which the individual bodies are resiliently supported.

8. An array as claimed in claim 1, further characterised in that each detector element comprises an individual body of the pyroelectric or ferroelectric material having lateral dimensions corresponding substantially to those of the respective infrared-collection area.

9. An array as claimed in claim 4, further characterised in that each body is mounted on an elevated conductive part of the pattern of conductors, which elevated conductive part is at a higher level than the level of the conductors on the part of the support between the outer detector elements.

10. An array as claimed in claim 9, further characterised in that the elevated conductive part is a thickened part of the pattern of conductors.

11. An array as claimed in claim 9, further characterised in that a recess is present in the part of the support between the outer detector elements, and that the conductors on this part extend on the bottom of the recess so as to be located at a lower level than the elevated conductive parts.

12. An array as claimed in claim 9, further characterised in that the elevated conductive part has a smaller width than the back electrode of the associated body.

* * * * *